United States Patent [19]

Mizuta et al.

[11] Patent Number: 5,017,973

[45] Date of Patent: May 21, 1991

[54] RESONANT TUNNELING DEVICE

[75] Inventors: Hiroshi Mizuta, Chofu; Tomonori Tanoue, Ebina; Chushirou Kusano, Tokorozawa; Susumu Takahashi, Tokyo, all of Japan

[73] Assignee: Hitachi, Ltd., Tokyo, Japan

[21] Appl. No.: 287,738

[22] Filed: Dec. 21, 1988

[30] Foreign Application Priority Data

Dec. 25, 1987 [JP] Japan ................. 62-327155

[51] Int. Cl.$^5$ ............................................. H01L 27/12
[52] U.S. Cl. ........................................ 357/4; 357/16; 357/57; 357/61
[58] Field of Search .................. 357/4 SL, 16, 57, 61

[56] References Cited

FOREIGN PATENT DOCUMENTS 0177374 4/1986 European Pat. Off. .......... 357/4 SL
0170044 5/1986 European Pat. Off. .

OTHER PUBLICATIONS

Summers et al.-Appl. Phys. Lett. 52(2), 11 Jan. 1988, pp. 132–134.
Morkoc et al.-Appl. Phy. Lett. 49(2), 14 Jul. 1986, pp. 70–72.
Jiang et al.-IEEE Trans. on Electron Dev., vol. 36, No. 12, Dec. 1989, pp. 2816–2820.
Japanese Journal of Allied Physics, vol. 24, pp. L466–L468, 1985.
Electronics Letters, vol. 22, No. 8, pp. 406–407, 1986.
Appl. Phys. Lett. 49, pp. 73–75, 1986.
"Resonant Tunneling Through Double Barriers, Perpendicular Quantum Transport Phenomena in Superlattices, and Their Device Applications", IEEE Journal of Quantum Electronics, vol. QE-22, No. 9, Sep. 1986, pp. 1853–1869.
"Thermally stimulated resonant current in AlGaAs/GaAs triple barrier diodes", Appl. Phys. Lett 51(6).10, Aug. 1987, pp. 445–447.

Primary Examiner—Edward J. Wojciechowicz
Attorney, Agent, or Firm—Kenyon & Kenyon

[57] ABSTRACT

A resonant tunneling device includes a superlattice layer which includes an interlaminated structure of three semiconductor layers each having a narrow energy bandgap and serving as a quantum well layer and four semiconductor layers each having a wide energy bandgap and serving as a barrier layer and in which three quantum levels are formed in the quantum well layers. A resonant tunneling phenomenon produced between the quantum levels provides peak current values which are substantially equal to each other, peak voltages which can be set independently from each other, and peak-to-valley (P/V) ratios which are high, thereby realizing a resonant tunneling device which has an excellent performance as a three state logic element for a logic circuit. By increasing the number of quantum well layers and the number of barrier layers, a logic element of four or more states can be realized for a logic circuit.

18 Claims, 3 Drawing Sheets

RESONANT TUNNELING DEVICE

BACKGROUND OF THE INVENTION

The present invention relates to a negative resistance element utilizing a resonant tunneling phenomenon in a semiconductor multi-barrier structure, and more particularly to a resonant tunneling device which can provide a negative resistance characteristic having substantially uniform or equal peak current values and can be used as a multiple (three or more) state logic element.

The conventional tunneling device employs a double-layer structure in which a semiconductor layer (or thin film) having a narrow energy bandgap is sandwiched by two semiconductor layers each having a wide energy bandgap, as is disclosed by the article entitled "Room Temperature Observation of Differential Negative Resistance in an AlAs/GaAs/AlAs Resonant Tunneling Diode", Japanese Journal of Applied Physics, Vol. 24, pp. L466-L468, 1985 and the article entitled "Observation of Resonant Tunneling Via First Excited Level in Double-Barrier Diode", Electronics Letters Vol. 22, No. 8, pp. 406-407, 1986, or a triple-barrier structure which includes an interlamination of two semiconductor layers each having a narrow energy bandgap three semiconductor layers each having a wide energy bandgap, as is disclosed by the article entitled "Observation of resonant tunneling in AlGaAs/GaAs triple barrier diodes", Applied Physics Letters, Vol. 49, pp. 73-75, 1986.

FIGS. 2A and 2B show energy band diagrams for the conduction band for the above-mentioned double-barrier and triple-barrier structures respectively. In the double-barrier structure shown in FIG. 2A, quantum levels $E_0$, $E_1$,—are formed in a quantum well layer 5 between first and second barrier layers 1 and 2 and a peak appears in a tunnel current each time the quantum level becomes equal to a quasi-Fermi level $E_{Fl}$ on the cathode side through application of a voltage V. In the triple-barrier structure shown in FIG. 2B, current peaks are produced by the tunneling from a quantum level $E_0^1$ formed in a first quantum well layer 5 between first and second barrier layers 1 and 2 (or a reference level for injection of electrons) to quantum levels $E_0^2$, $E_1^2$-,—formed in a second quantum well layer 6 between second and third barrier layers 2 and 3, that is, $E_0^1 \rightarrow E_0^2$, $E_0^1 \rightarrow E_1^2$,—.

However, the current versus voltage characteristic of each of the conventional tunneling devices exhibits remarkably different peak current values, as shown in FIG. 3, and hence it is difficult to use it as a multiple state logic element. Also, each of peak voltages $V_1$, $V_2$,—is determined by quantum levels formed in one quantum well and hence it is difficult to control the peak voltages independently from each other. Accordingly, a solution of these problems is desired.

SUMMARY OF THE INVENTION

The present invention provides a resonant tunneling device which can provide a negative resistance characteristic having substantially equal peak current values and allowing independent control of peak voltages and can be used as a three or more state logical element.

According to the present invention, three quantum levels are formed by providing an interlaminated structure of three semiconductor layers each having a narrow energy bandgap and serving as a quantum well layer and four semiconductor layers each having a wide energy bandgap and serving as a barrier layer, and a resonant tunneling phenomenon produced between the quantum levels is utilized to provide a resonant tunneling device which has substantially equal peak current values and high peak-to-valley (P.V) ratios. Provided that the three semiconductor layers having narrow energy bandgaps are termed first, second and third quantum well layers from the cathode electrode side, peak voltages $V_1$ and $V_2$ can be independently changed by the thicknesses of the third and second quantum well layers, respectively. The resonant tunneling device exhibits excellent performance as a three state logic element for a logic circuit.

By increasing the number of semiconductor layers having narrow energy bandgaps and the number of semiconductor layers having wide energy bandgaps, a four or more state logic element for a logic circuit can be realized.

DETAILED DESCRIPTION OF THE PREFERRED EMBODIMENTS

Embodiments of the present invention will now be explained in reference with the accompanying drawings.

Figure 1:
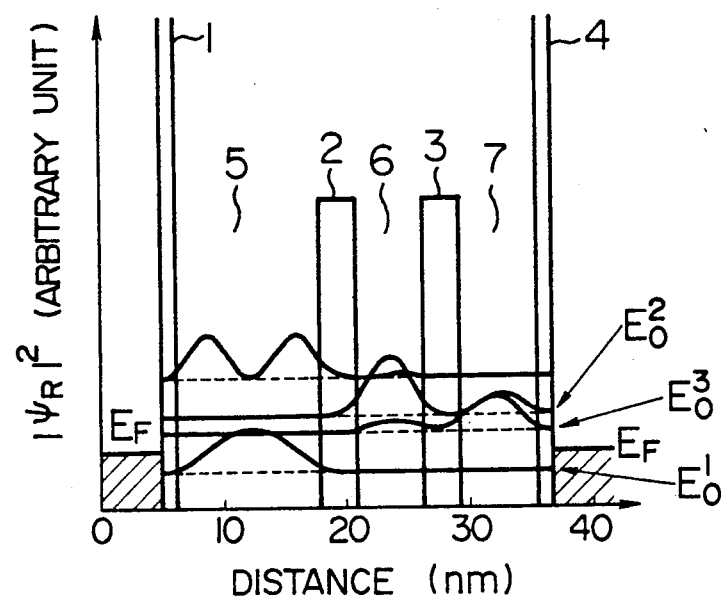
FIG. 1 shows an energy band diagram for conduction band in a resonant tunneling device having a quadruple-barrier structure according to an embodiment of the present invention.
Figure 2A:
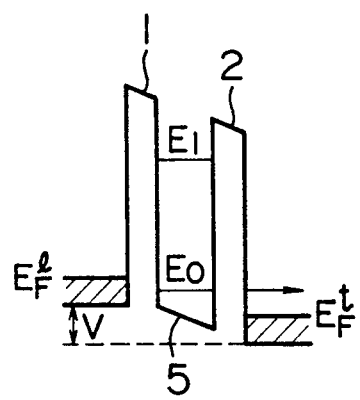
FIGS. 2A and 2B shows energy band diagrams for conduction band in the conventional resonant tunneling device having a double-barrier structure and the conventional resonant tunneling device having a triple-barrier structure for the purpose of explaining the principles of operation of those devices.
Figure 2B:
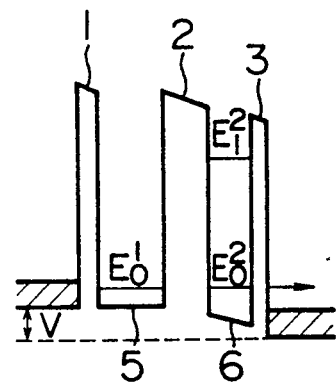
Figure 3:
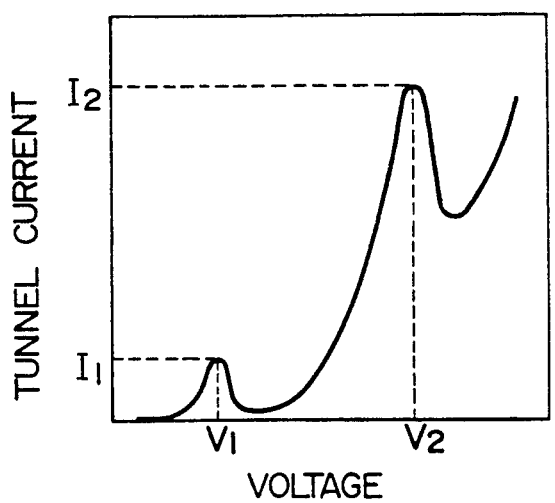
FIG. 3 is a graph showing the current versus voltage characteristic measured for the conventional tunneling device.

FIG. 1 shows an energy band diagram for conduction band in a resonant tunneling device having a quadruple-barrier structure according to an embodiment of the present invention. The resonant tunneling device includes an interlaminated structure of three semiconductor layers each of which has a narrow energy bandgap and which serve as first, second and third quantum well layers 5, 6 and 7 and four semiconductor layers each of which has a wide energy bandgap and which serve as first, second, third and fourth barrier layers 1, 2, 3 and 4. Three quantum levels $E_0^1 E_0^2$ and $E_0^3$ are formed and resonant tunnel effects of $E_0^1 \rightarrow E_0^3$ and $E_0^1 \rightarrow E_0^2$ are exhibited.

Figure 4:
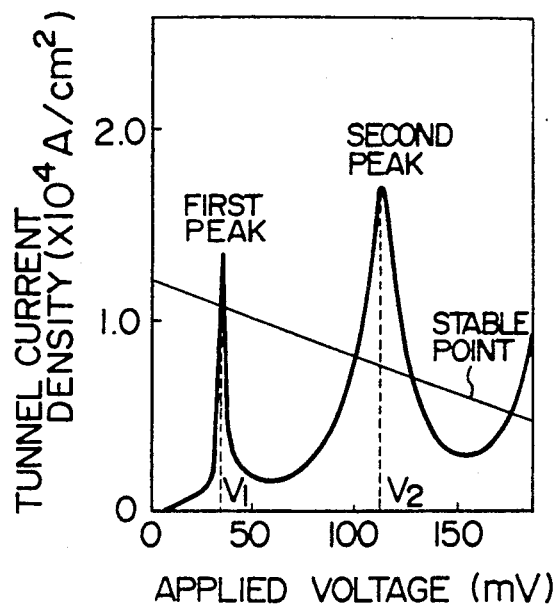
FIG. 4 is a graph showing the current versus voltage characteristic obtained through simulation for a resonant tunneling device according to the present invention.
Figure 5A:
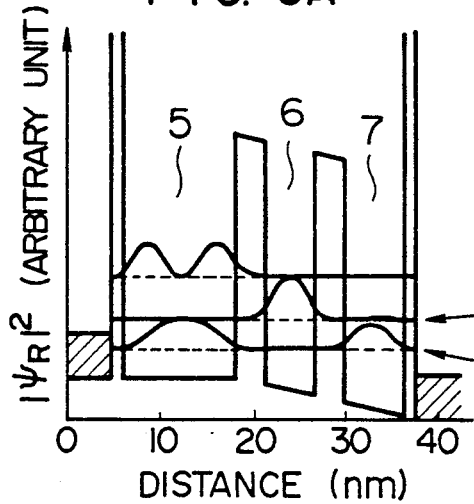
FIGS. 5A and 5B shows energy band diagrams for conduction band in a resonant tunneling device according to the present invention for the purpose of explaining the principle of operation thereof.
Figure 5B:
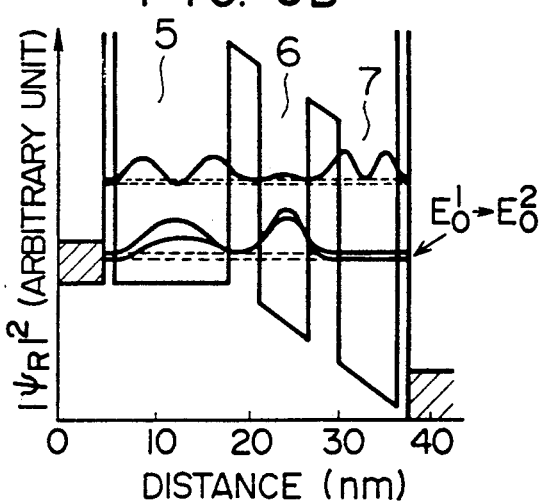
Figure 6A:
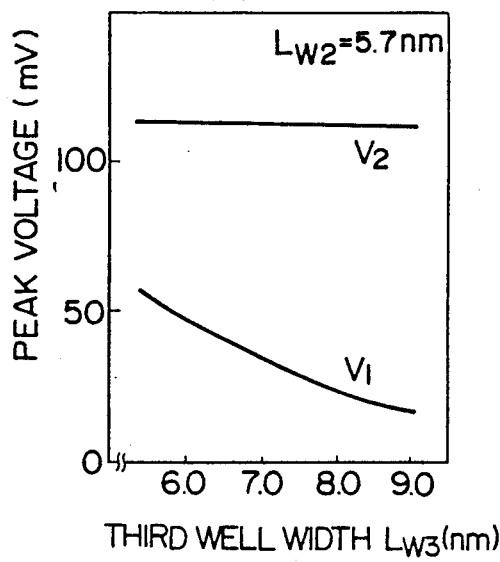
FIGS. 6A and 6B are views showing a relation between a peak voltages $V_1$ and a third quantum well layer thickness $L_{W3}$ and a relation between a peak voltage $V_2$ and a second quantum well layer thickness $L_{W2}$ obtained through simulation for a resonant tunneling device according to the present invention.
Figure 6B:
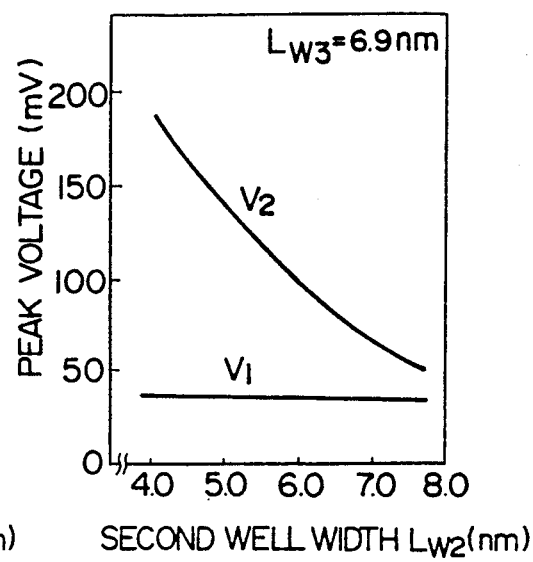

FIG. 4 shows the current versus voltage characteristic obtained through simulation for a quadruple-barrier resonant tunneling device according to an embodiment of the present invention. The device includes a successive lamination of AlAs (10 Å thickness), GaAs (119 Å), AlGaAs (30 Å), GaAs (57 Å), AlGaAs (30 Å), GaAs (69 Å) and AlAs (10 Å) and further includes n+ type GaAs layers for cathode and anode each of which has a carrier concentration of $1 \times 10^{18}$ cm$^{-3}$. From FIG. 4, it can be understood that a negative resistance characteristic is obtained with first and second peak currents having values substantially equal to each other, and three stable points are obtained by virtue of a load line shown in the figure. The first and second current peaks are caused by a resonant tunneling phenomenon as will be explained just below. FIGS. 5A and 5B show the quantum levels for conduction band and the existence probabilities of electrons corresponding to first and second current peaks, respectively. From those figures, it can be understood that the first current peak is caused by a resonant tunneling from a quantum level $E_0^1$ in a first quantum well layer 5 to a quantum level $E_0^3$ in a third quantum well layer 7, and the second current peak is caused by a resonant tunneling from the quantum level $E_0^1$ in the first quantum well layer 5 to a quantum level $E_0^2$ in a second quantum well layer 6. Therefore, peak voltages $V_1$ and $V_2$ (see FIG. 4) can be independently changed by the widths or thicknesses of the third and second quantum well layers 7 and 6, respectively. FIG. 6A shows the peak voltages $V_1$ and $V_2$ in the case where the width $Lw_2$ of the second quantum well layer 6 is fixed to 57 Å and the width $Lw_3$ of the third quantum well layer 7 is changed. It is seen from FIG. 6A that when $Lw_3$ is changed, the peak voltage $V_2$ has no change but the peak voltage $V_1$ greatly changes. FIG. 6B shows the case where $Lw_3$ is fixed to 69 Å and $Lw_2$ is changed. It is seen from FIG. 6B that only the peak voltage $V_2$ has a substantial change.

As has been mentioned above, the resonant tunneling device according to the present embodiment has two clear or distinct current peaks in its current versus voltage characteristic, and the first and second peak voltages can be independently changed by the widths or thicknesses of the third and second quantum well layers, respectively.

Next, a method of fabricating a resonant tunneling device according to an embodiment of the present invention will be explained in reference with FIGS. 7A to 7D.

Figure 7A:
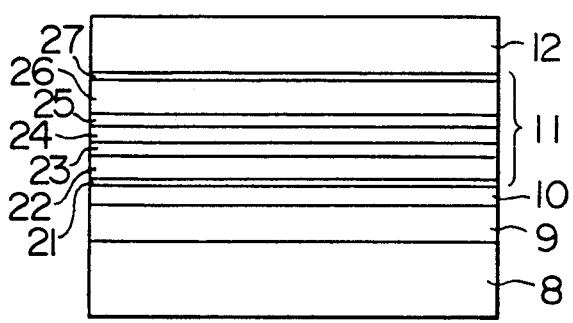
FIGS. 7A to 7D are cross sections showing process steps for fabrication of a resonant tunneling device according to an embodiment of the present invention.

As shown in FIG. 7A, an n+ type GaAs layer 9 having a carrier concentration of $1 \times 10^{18}$ cm$^{-3}$ and a thickness of 2000 Å and an i-type GaAs layer 10 having a thickness of 50 Å are grown on an n+ type GaAs substrate 8 through an MBE (Molecular Beam Epitaxy) method. Thereafter, a superlattice layer 11 and an n+ type GaAs layer 12 having a carrier concentration of $1 \times 10^{18}$ cm$^{-3}$ and a thickness of 3000 Å are grown on the i-GaAs layer 10. The superlattice layer 11 includes a first barrier layer 27 made of i-AlAs and 10 Å thick, a first quantum well layer 26 made of i-GaAs and 119 Å thick, a second barrier layer 25 made of i-Al$_{0.3}$Ga$_{0.7}$As and 30 Å thick, a second quantum well layer 24 made of i-GaAs and 57 Å thick, a third barrier layer 23 made of i-Al$_{0.3}$Ga$_{0.7}$As and 30 Å thick, a third quantum well layer 22 made of i-GaAs and 69 Å thick, and a fourth barrier layer 21 made of i-AlAs and 10 Å thick in this order from the n+ type GaAs layer 12. The quantum well layers have in their widths a relation of the first quantum well layer 26 (on the cathode side) > the third quantum well layer 22 (on the anode side) > the second quantum well layer 24.

In the above embodiment, the MBE method has been used as an epitaxial growth method. Alternatively, an MOCVD (Metal Organic Chemical Vapor Deposition) method, an MOMBE (Metal Organic Molecular Beam Epitaxy) method, an ALE (Atomic Layer Epitaxy) method or the like may be employed as the epitaxial growth method.

Figure 7B:
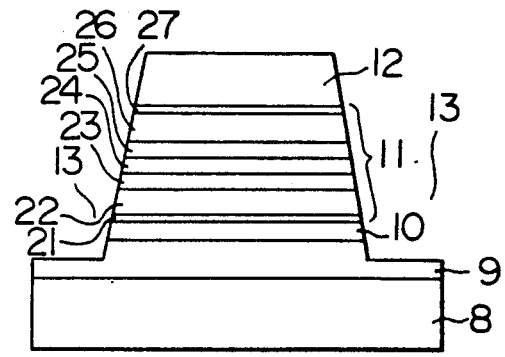

Next, a mesa region 13 is formed through a usual photolithography technique, as shown in FIG. 7B.

Figure 7C:
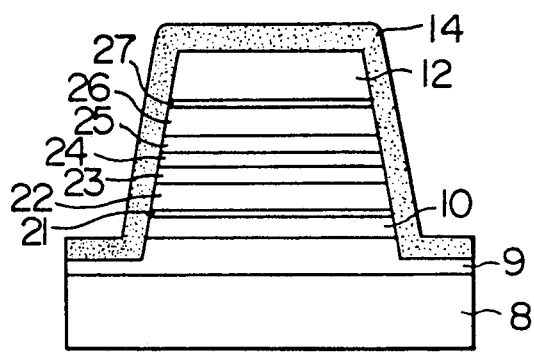

Thereafter, an SiO$_2$ layer 14 having a thickness of 4000 Å is grown by means of a CVD method, as shown in FIG. 7C.

Figure 7D:
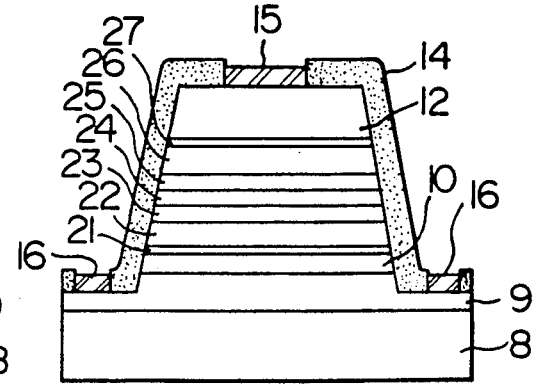

Finally, as shown in FIG. 7D, a cathode electrode 15 and an anode electrode 16 are formed by means of a usual lift-off method. For example, AuGe, W, Ni and Au as electrode materials are vapor-deposited with 600 Å, 100 Å, 100 Å and 800 Å, respectively.

Figure 8:
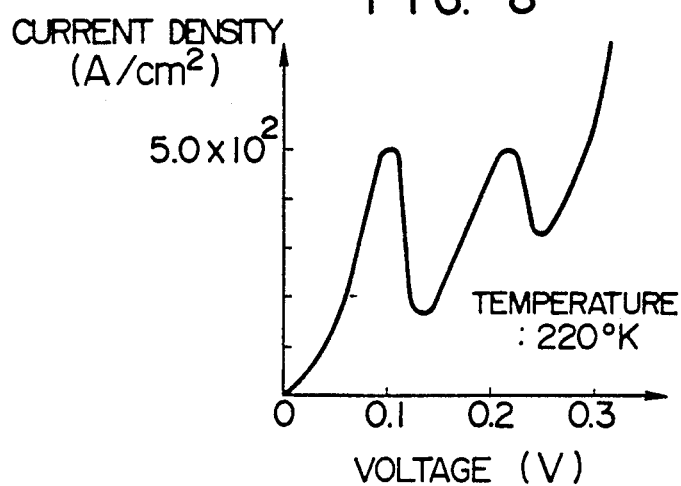
FIG. 8 is a view showing a relation between a current density and a voltage measured for a resonant tunneling device according to an embodiment of the present invention.

The current versus voltage characteristic of the resonant tunneling device thus fabricated has been measured, and the result of measurement is shown in FIG. 8. As shown in the figure, there is obtained a negative resistance characteristic having peak current densities of $5.0 \times 10^2$ (A/cm$^2$) substantially equal to each other at peak voltages $V_1 = 0.1$ (V) and $V_2 = 0.2$ (V) at 220 °K is obtained. A peak-to-valley (P/V) ratio is as high as it is about 3/1 for the first peak and about 1.5/1 for the second peak.

A similar effect is also obtained when i-AlAs layers (10 Å) are used in place of the i-Al$_{0.3}$Ga$_{0.7}$As layers 23 and 25 (30 Å) in the superlattice layer 11. The similar effect is further obtained when an n+ type InP substrate, InGaAs layers, InAlGaAs or InAlAs layers, and InAlAs layers are used in place of the n+ type GaAs substrate 8, the GaAs layers 22, 24, 26, the AlGaAs layers 23, 25, and the AlAs layers 21, 27, respectively.

According to the present invention, a resonant tunneling device is obtained which has peak current values substantially equal to each other, peak voltages capable of being set independently from each other, and high peak-to-valley (P/V) ratios. When the resonant tunneling device is applied to a multiple state logic element for a logic circuit, a great effect is obtained.

In the foregoing, the present invention has been explained in conjunction with the quadruple-barrier resonant tunneling device which can be used as a three state logic element. However, by increasing the number of barrier layers and the number of quantum well layers, there may be realized a resonant tunneling device which can be used as a multiple (four or more) state logic element.

What is claimed is:

1. A resonant tunneling device comprising:
   a cathode electrode;
   an anode electrode;
   a super-lattice layer having an interlaminated structure comprising first, second, third and fourth barrier layers each made of a semiconductor layer having a wide energy bandgap, a first, a second and a third quantum well layers disposed in an order from said cathode electrode to said anode electrode and each made of a semiconductor layer having a narrow energy bandgap, wherein a thickness of said third quantum well layer is larger than that of said second quantum well layer and a thickness of said first quantum well layer is larger than that of said third quantum well layer and wherein a resonant tunneling phenomenon is produced between quantum well levels formed in said quantum well layers.

2. A resonant tunneling device according to claim 1, wherein said resonant tunneling phenomena is produced between adjacent two quantum levels formed in said quantum well layers.

3. A resonant tunneling device according to claim 1, wherein a negative resistance characteristic is produced by said resonant tunneling phenomenon so as to have peak current values substantially equal to each other, thereby providing a multiple state logic element.

4. A resonant tunneling device according to claim 1, wherein the values of two peak voltages produced by said resonant tunneling phenomenon are controlled by the thicknesses of said second and third quantum well layers, respectively.

5. A resonant tunneling device according to claim 1, wherein each of said first to fourth barrier layers includes an $Al_xGa_{1-x}As$ layer, x being a composition ratio of Al to Ga, and each of said first to third quantum well layers includes a GaAs layer.

6. A resonant tunneling device according to claim 5, wherein the composition ratio x of Al to Ga is not smaller than 0.8 for said first and fourth barrier layers and falls within a range between 0.2 and 0.4 for said second and third barrier layers.

7. A resonant tunneling device according to claim 6, wherein the composition ratio x of Al to Ga is 1.0 for said first and fourth barrier layers and is 0.3 for said second and third barrier layers.

8. A resonant tunneling device according to claim 6, wherein the thickness of each of said first and fourth barrier layers falls within a range between 8 Å and 50 Å and the thickness of each of said second and third barrier layers falls within a range between 10 Å and 100 Å.

9. A resonant tunneling device according to claim 8, wherein the thickness of each of said first and fourth barrier layers is 10 Å and the thickness of each of said second and third barrier layers is 30 Å.

10. A resonant tunneling device according to claim 1, wherein each of said first to fourth barrier layers includes an InAlAs layer and each of said first to third quantum well layers includes an InGaAs layer.

11. A resonant tunneling device according to claim 1, wherein each of said first and fourth barrier layers includes an InAlAs layer, each of said second and third barrier layers includes an InAlGaAs layer and each of said first to third quantum well layers includes an InGaAs layer.

12. An n-state logic element where $n \geq 3$, comprising:
a cathode electrode;
an anode electrode; and
a super-lattice structure disposed between said cathode and anode electrode and comprising a layered structure including
m barrier regions each made of a semiconductor layer having a wide energy bandgap;
n quantum well layers, each layer having a respective thickness ($L_1, L_2, \ldots, L_{n-1}, L_n$);
wherein a first barrier region is adjacent said cathode electrode and an mth barrier region is adjacent said anode
electrode and $m = n+1$;
wherein the well layer thicknesses are defined such that $L_1 > L_n > L_{n-1}$; and
wherein a resonant tunneling phenomenon is produced between quantum well levels formed in said quantum well regions.

13. A resonant tunneling device according to claim 12, wherein a negative resistance characteristic is produced by said resonant tunneling phenomenon so as to have peak current values substantially equal to each other, thereby providing a multiple state logic element.

14. A resonant tunneling device according to claim 12, wherein said resonant tunneling phenomena is produced between adjacent two quantum levels formed in said quantum well layers.

15. A resonant tunneling device according to claim 12, wherein each of said fourth m barrier layers includes an $Al_xGa_{1-x}As$ layer, x being a composition ratio of Al to Ga, and each of said n quantum well layers includes a GaAs layer.

16. A resonant tunneling device according to claim 13, wherein each of said m barrier layers includes an $Al_xGa_{1-x}As$ layer, x being a composition ratio of Al to Ga, and each of said n quantum well layers includes a GaAs layer.

17. A resonant tunneling device according to claim 14, wherein each of said m barrier layers includes an $Al_xGa_{1-x}As$ layer, x being a composition ratio of Al to Ga, and each of said n quantum well layers includes a GaAs layer.

18. A resonant tunneling device according to claim 14, wherein said resonant tunneling phenomena is produced between adjacent two quantum levels formed in said quantum well layers.

* * * * *

UNITED STATES PATENT AND TRADEMARK OFFICE
CERTIFICATE OF CORRECTION

PATENT NO. : 5,017,973

DATED : May 21, 1991

INVENTOR(S) : Hireshi Mizuta, et al

It is certified that error appears in the above-identified patent and that said Letters Patent is hereby corrected as shown below:

| Column | Line | |
|--------|------|---|
| 1 | 44 | Change "$E_0^2$, $E_1^2$-" to -- $E_0^2$, $E_1^2$ --. |
| 3 | 4 | After "$E_0^1$" insert --,--. |
| 6 | 46 | Change "$Al_xGa_1$" to --$Al_xGa_1$--. |
| 6 | 46 | Change "ratio of Al" to --ratio of Al--. |

Signed and Sealed this

Fifteenth Day of December, 1992

*Attest:*

DOUGLAS B. COMER

*Attesting Officer*      *Acting Commissioner of Patents and Trademarks*